(12) United States Patent
Wu

(10) Patent No.: US 7,075,113 B2
(45) Date of Patent: Jul. 11, 2006

(54) SEMICONDUCTOR DEVICE AND METHOD FOR FABRICATING THE SAME

(75) Inventor: Chih-Hung Wu, Taoyuan (TW)

(73) Assignee: Atomic Energy Council Institute of Nuclear Energy Research, Taoyuan (TW)

(*) Notice: Subject to any disclaimer, the term of this patent is extended or adjusted under 35 U.S.C. 154(b) by 95 days.

(21) Appl. No.: 10/704,089

(22) Filed: Nov. 7, 2003

(65) Prior Publication Data
US 2005/0029525 A1    Feb. 10, 2005

(30) Foreign Application Priority Data
Aug. 6, 2003    (TW) .............................. 92121548 A

(51) Int. Cl.
*H01L 33/00*    (2006.01)
(52) U.S. Cl. ........................................ 257/91; 257/766
(58) Field of Classification Search ................ 257/745, 257/751, 763, 766, 764, 587, 79, 83, 85, 257/88, 91
See application file for complete search history.

(56) References Cited

U.S. PATENT DOCUMENTS 5,436,497 A * 7/1995 Miyauchi et al. ........... 257/587
5,523,623 A * 6/1996 Yanagihara et al. ........ 257/745
6,804,276 B1 * 10/2004 Gen-ei et al. ................ 372/36

FOREIGN PATENT DOCUMENTS

DE    4401858    7/1995

* cited by examiner

*Primary Examiner*—Howard Weiss
*Assistant Examiner*—(Vikki) Hoa B. Trinh
(74) *Attorney, Agent, or Firm*—Egbert Law Offices

(57)    ABSTRACT

A light-emitting device and method for fabricating the same are revealed. The light-emitting device includes an epitaxial structure, a P-type ohmic contact electrode and an N-type ohmic contact electrode. The epitaxial structure includes a plurality of epitaxial layers capable of emitting light and P-type contact layer. The P-type ohmic contact electrode includes a first nickel layer deposited on the epitaxial structure, a first platinum layer deposited on the first nickel layer, and a first gold layer deposited on the first platinum layer. According to the fabricating method of the light-emitting device, an epitaxial structure is first formed on the surface of a substrate, a P-type ohmic contact electrode is then formed on the epitaxial structure, and an N-type ohmic contact electrode is formed on the other surface of the substrate. Finally, an annealing process is performed at a temperature between 220° C. and 330° C.

4 Claims, 7 Drawing Sheets

SEMICONDUCTOR DEVICE AND METHOD FOR FABRICATING THE SAME

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to a semiconductor device and method for fabricating the same, and more particularly, to a light-emitting device and method for fabricating the same, which has a stable output power due to using a new P-type ohmic contact electrode.

BACKGROUND OF THE INVENTION

The ohmic contact electrode provides an important medium and path for the operational current required by the light-emitting device. However, the currently available light-emitting devices require a higher annealing temperature and a more complicated manufacturing procedure to form an electrode with a good ohmic contact property. Therefore, how to improve the property of the ohmic contact electrode and simplify the manufacturing procedure to reduce the cost becomes the important subject of the present research. According to the prior art, the manufacturing methods for the ohmic contact electrode of the light-emitting devices are mainly divided into a two-step manufacturing procedure and a single-step manufacturing procedure.

With respect to the two-step manufacturing procedure, appropriate metallic films are formed on the epitaxial structure on the bottom surface and the upper surface of a substrate (gallium arsenide, for instance) at first, such as gold-germanium alloy/nickel/gold on the N-type gallium arsenide (GaAs) substrate or gold-zinc alloy on the P-type GaAs substrate by a vapor phase deposition process. The metallic films form the ohmic contact electrode with the ohmic contact property through an annealing process. Finally, a thick metallic pad (for example a thick gold layer) is formed on the ohmic contact electrode for the subsequent metal wire bonding. This method requires a high annealing temperature (higher than 380° C.), and the surface of the ohmic contact electrode after the annealing process is very rough and inadequate for the subsequent metal wire bonding. Additionally, at least two lithographic processes are required, so the manufacturing procedure is complicated.

Regarding the single-step manufacturing procedure, the above-mentioned thick metallic pad and the ohmic contact metallic films are formed in the same manufacturing procedure, and an annealing process is then performed to form the ohmic contact electrode. For example, after forming the gold-germanium alloy/nickel/gold on the N-type GaAs substrate and titanium/palladium/gold alloy on the P-type GaAs substrate by the vapor phase deposition, the ohmic contact electrode and the thick metallic pad are then formed by an annealing process simultaneously. The advantage of the single-step manufacturing procedure is the simpler process, and that the surface 6f the ohmic contact electrode still stays uniform after the annealing process is performed, which is adequate for the subsequent metal wire bonding.

The P-type ohmic contact electrode formed on the P-type GaAs usually consists of multiple metallic layers. For example, German patent (DE Patent No. 4,401,858) discloses a P-type ohmic contact electrode consisting of a plurality of gold/gold-zinc/gold layers by the vapor phase deposition, wherein the annealing temperature is between 360° C. and 480° C. In addition, U.S. Pat. No. 5,523,623 discloses a P-type ohmic contact electrode consisting of a plurality of nickel/titanium/platinum layers or nickel/titanium/palladium by the vapor phase deposition, wherein the annealing temperature is between 370° C. and 420° C.

FIG. 1 is a cross-sectional diagram of a light-emitting device 10 according to the prior art. As shown in FIG. 1, the light-emitting device 10 includes a substrate 12, an epitaxial structure 20 positioned on the upper surface of the substrate 12, an N-type ohmic contact electrode 14 positioned on the bottom surface of the substrate 12, and a P-type ohmic contact electrode 30 positioned on the epitaxial structure 20. The epitaxial structure 20 consists of a first reflection layer 22, a light-emitting layer 24, a second reflection layer 26 and a P-type contact layer 16, wherein the reflectivity of the first reflection layer 22 is larger than or equal to that of the second reflection layer 26.

The P-type ohmic contact electrode 30 consists of gold-beryllium alloy or gold-zinc alloy. When the gold-beryllium alloy or the gold-zinc alloy is used to form the P-type ohmic contact electrode 30, an annealing process must be performed at a high temperature between 380° C. and 400° C. to ensure the formation of a preferred ohmic contact electrode. However, the annealing process at the high temperature between 380° C. and 400° C. will result in deterioration of the surface of the P-type ohmic contact electrode 30, which is inadequate for the subsequent metal wire bonding. On the contrary, to ensure the formation of the P-type contact electrode 30 with a surface appropriate for the subsequent metal wire bonding, the temperature of the annealing process has to be decreased, which however will result in deterioration of the ohmic contact property between the P-type ohmic contact electrode 30 and the P-type contact layer 16.

FIG. 2 is a cross-sectional diagram of another light-emitting device 40 according to the prior. The difference between FIG. 2 and FIG. 1 is that the P-type ohmic contact electrode 30 in FIG. 2 is a double-layer structure. As shown in FIG. 2, the P-type ohmic contact electrode 30 consists of a nickel layer 31 and a gold layer 32. The nickel layer 31 and the P-type contact layer 16 can form good adhesion characteristics, while the gold layer 32 is appropriate for the subsequent metal wire bonding. In order to ensure the formation of an ideal ohmic contact property with the P-type contact layer 16, an annealing process must be performed at approximately 400° C. to the P-type ohmic contact electrode 30 consisting of the nickel layer 31 and the gold layer 32.

FIG. 3 shows the surface of the P-type ohmic contact electrode 30 in FIG. 2 after the annealing process is performed at 400° C. for sixty seconds (magnification ratio: 400 times). The circular area is the epitaxial layer that does not require to deposit the P-type contact electrode metal, and the thickness of the nickel layer 31 is 50 nanometer (nm) and the thickness of gold layer 32 is 350 nm. Obviously, the surface of P-type ohmic contact electrode 30 has many concaves and convexes, which is inadequate for the subsequent metal wire bonding.

FIG. 4 is a cross-sectional diagram of another light-emitting device 50 according to the prior art. FIG. 4 is different from FIG. 1 and FIG. 2 in that the P-type ohmic contact electrode 30 is a three-layer structure. As shown in FIG. 4, the P-type ohmic contact electrode 30 consists of a titanium layer 33, a platinum layer 34 and a gold layer 35. The annealing temperature can be decreased to 350° C., and the P-type ohmic contact electrode 30 still possesses an appropriate surface for the subsequent metal wire bonding.

FIG. 5 shows the input current/output power curve of the light-emitting device 50 in FIG. 4. As shown in FIG. 5, the input current/output power curve of the light-emitting device 50 is not linear (the slope of the curve decreases with the increase of the input current), which makes it difficult to control the output power of the light-emitting device 50 by the input current.

From the above-mentioned prior art, the formation of the P-type ohmic contact electrode requires a higher annealing temperature, which will result in the unwanted cross-diffusion between layers of the epitaxial structure and damage the optoelectrical property of the device. Therefore, how to reduce the annealing temperature and form the ideal ohmic contact electrode becomes an important subject matter.

BRIEF SUMMARY OF THE INVENTION

The objective of the present invention is to provide a light-emitting device and method for fabricating the same, which uses a new P-type ohmic contact electrode to have a stable power output.

In order to achieve the above-mentioned objective, and avoid the problems of the prior art, the light-emitting device of the present invention comprises an N-type GaAs substrate, an epitaxial structure positioned on the substrate and a P-type ohmic contact electrode positioned on the epitaxial structure. The epitaxial structure comprises a first reflection layer, a light-emitting layer, a second reflection layer and a P-type GaAs contact layer. The P-type ohmic contact electrode comprises a first nickel layer positioned on the epitaxial structure, a first platinum layer positioned on the first nickel layer and a gold layer positioned on the first platinum layer.

According to the method for fabricating the light-emitting device of the present invention, an epitaxial structure is formed on a first surface of a substrate, wherein the epitaxial structure comprises a plurality of epitaxial layers and a P-type GaAs contact layer. A photolithographic and an etching process are then performed to form a pattern for defining the P-type ohmic contact electrode on the epitaxial structure; and a metallic film for the P-type ohmic contact electrode is deposited on the P-type GaAs contact layer. An N-type ohmic contact electrode is formed on the other surface of the substrate, wherein the N-type ohmic contact electrode consists of a conventional material from gold-germanium alloy, nickel and gold. The P-type ohmic contact electrode comprises a first nickel layer positioned on the epitaxial structure for providing better adhesion and forming a better ohmic contact property with the P-type contact layer, a first platinum layer positioned on the nickel layer for providing a better diffusion barrier to prevent the gold and the GaAs contact layer from the cross-diffusion, and a gold layer positioned on the platinum layer for providing a better conductive connection and wire bonding. Finally, an annealing process is performed in a hydrogen atmosphere at a temperature between 220° C. and 330° C.

Compared with the prior art, the present invention possesses following advantages:

1. The annealing temperature can be reduced to a range between 220° C. and 330° C., the P-type ohmic contact electrode and the P-type contact layer still possesses a preferred ohmic contact property, and the surface of the P-type ohmic contact electrode is still adequate for the subsequent wire bonding.

2. The P-type ohmic contact electrode still possesses a uniform surface morphology after the annealing process is performed, and the metal wire can be bonded on the surface of the P-type ohmic contact electrode directly without an extra gold layer for the wire bonding. As a result, the present invention only needs one mask for defining the position and the size of the P-type ohmic contact electrode, thus the present invention can simplify the fabrication process.

3. The present light-emitting device has a wider linear range in the input current/output power curve. Furthermore, under the same input current, the present light-emitting device has higher output power.

4. The present fabricating method for the P-type ohmic contact electrode and the N-type ohmic contact electrode at lower annealing temperature can also be applied to other semiconductor devices, such as the metal field effect transistor, the PIN diode, the photosensitive diode, the photosensitive transistor and the solar cell, etc.

BRIEF DESCRIPTION OF THE SEVERAL VIEWS OF THE DRAWINGS

Other objectives and advantages of the present invention will become apparent upon reading the following descriptions and upon reference to the accompanying drawings.

DETAILED DESCRIPTION OF THE INVENTION

Figure 6:
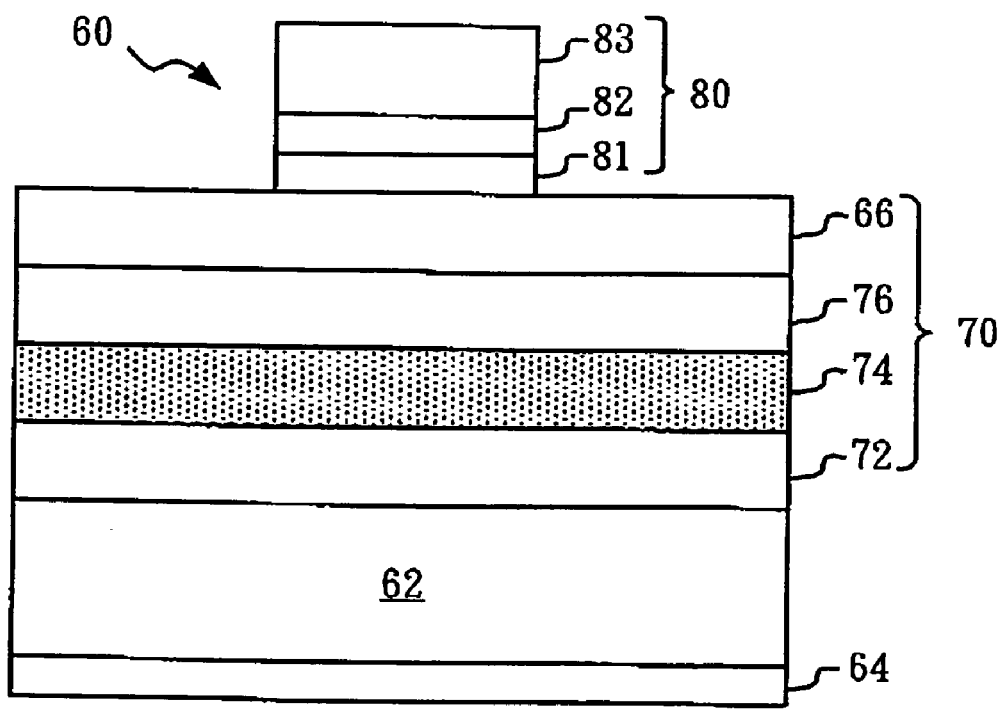
FIG. 6 is a cross-sectional view of a light-emitting de according to the first embodiment of the present invention.

FIG. 6 is a cross-sectional diagram of a light-emitting device 60 according to the first embodiment of the present invention. As shown in FIG. 6, the light-emitting device 60 comprises an N-type GaAs substrate 62, an epitaxial structure 70 positioned on the upper surface of the N-type GaAs substrate 62, an N-type ohmic contact electrode 64 positioned on the bottom surface of the N-type GaAS substrate 62, and a P-type ohmic contact electrode 80 positioned on the epitaxial structure 70. The epitaxial structure 70 consists of a first reflection layer 72, a light-emitting layer 74, a second reflection layer 76 and a P-type GaAs contact layer 66. The carrier density of the P-type GaAs contact layer 66 is more than $10^{19}/cm^3$, and the reflectivity of the first reflection layer 72 is more than or equal to that of the second reflection layer 76.

The P-type ohmic contact electrode 80 of the present invention can be a three-layer structure including a first nickel layer 81 positioned on the P-type GaAs contact layer 66, a first platinum layer 82 positioned on the first nickel layer 81 and a first gold layer 83 positioned on the first nickel layer 82. The first nickel layer 81 can form a good adhesion with the P-type GaAs contact layer 66, while the first gold layer 83 has an appropriate surface morphology for the subsequent metal wire bonding. The thicknesses of the first nickel layer 81, the first platinum layer 82 and the first gold layer 83 are between 10 angstroms and 10000 angstroms.

Figure 7:
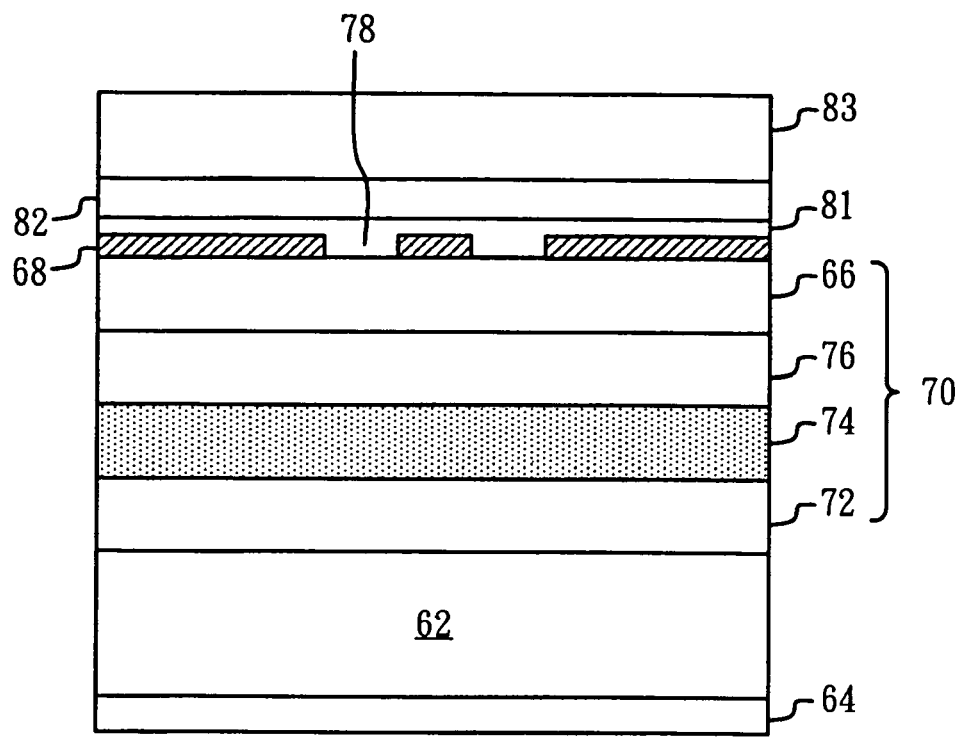
FIG. 7 is a schematic view showing the method for fabricating light-emitting device according to the present invention.

FIG. 7 is a schematic diagram showing the method for fabricating the light-emitting device 60 according to the present invention. As shown in FIG. 7, the present invention first forms the epitaxial structure 70 on the upper surface of the N-type GaAs substrate 62. A photoresist layer 68 is then formed on the P-type GaAs contact layer 66, and a photolithographic and an etching process are performed to form a photoresist pattern with an opening 78, which exposes a portion of the P-type GaAs contact layer 66 where the P-type ohmic contact electrode 80 is to be formed. The first nickel layer 81, the first platinum layer 82 and the first gold layer 83 are deposited in sequence to cover the exposed P-type GaAs contact layer 66 and the photoresist layer 68. Subsequently, a lift-off process is performed in an acetone solution with ultrasonic oscillation to remove the photoresist layer 68, the first nickel layer 81, the first platinum layer 82 and the first gold layer 83 right above the photoresist layer 68.

After the photoresist layer 68 is stripped, only the first nickel layer 81, the first platinum layer 82 and the first gold layer 83 right above the opening 78 remain on the surface of P-type GaAs contact layer 66, and the P-type ohmic contact electrode 80 is formed. After the P-type ohmic contact electrode 80 is completed, the N-type ohmic contact electrode 64 is formed on the bottom surface of the substrate 62, wherein the N-type ohmic contact electrode 64 consists of gold-germanium alloy, nickel and gold. The annealing process is then performed in an environment full of hydrogen at a temperature between 220° C. and 330° C. The manufacturing procedures for the above-mentioned P-type ohmic contact electrode 80 and the N-type ohmic contact electrode 64 can be interchanged, and then the annealing process is performed. In addition, because the first nickel layer 81 can form good adhesion with the P-type GaAs contact layer 66 and the first gold layer 83 is suitable for metal wire bonding, the present invention only needs one mask for defining the position and the size of the P-type ohmic contact electrode 80 such that both the good ohmic contact property and the good metal wire bonding are fulfilled. Furthermore, the P-type ohmic contact electrode 80 and the N-type contact electrode 64 can be formed in the same annealing process at a lower temperature.

Figure 8:
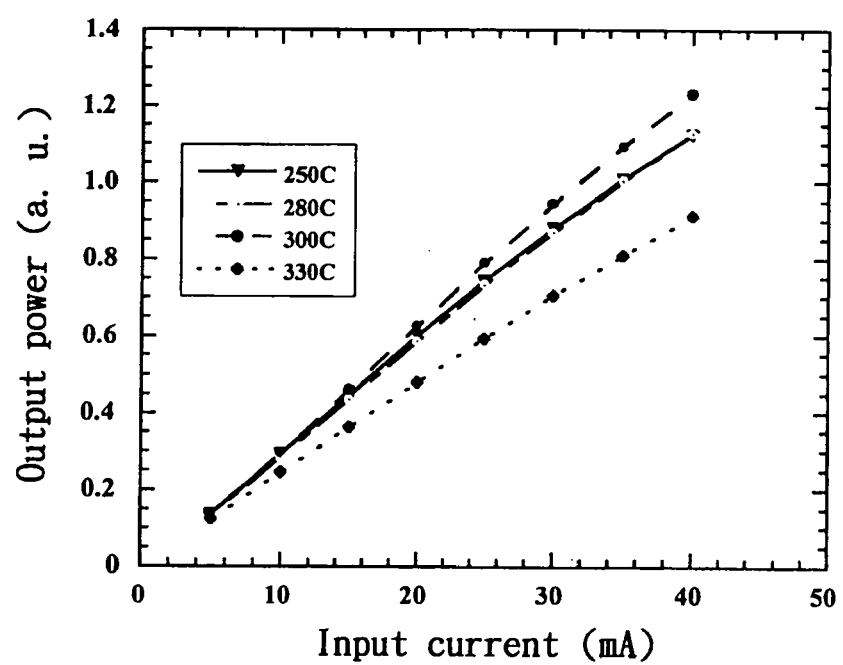
FIG. 8 shows another graphic illustration of the relationship between the annealing temperature and the output power/input current of the light-emitting device according to the present invention.

FIG. 8 shows the relationship between the annealing temperature and the output power/input current of the light-emitting device 60 according to the present invention, wherein the thickness of the first nickel layer 81 is 50 nm, the thickness of the first platinum layer 82 is 80 nm, and the thickness of the first gold layer 83 is 350 nm. As shown in FIG. 8, the output power/input current curve of the present light-emitting device 60 has a linear relationship when the annealing temperature are 250, 280, 300 and 330° C., i.e., if the annealing process is performed at a range between 250 and 330° C., the present light-emitting device 60 can output a desired power by controlling the input current.

Figure 3:
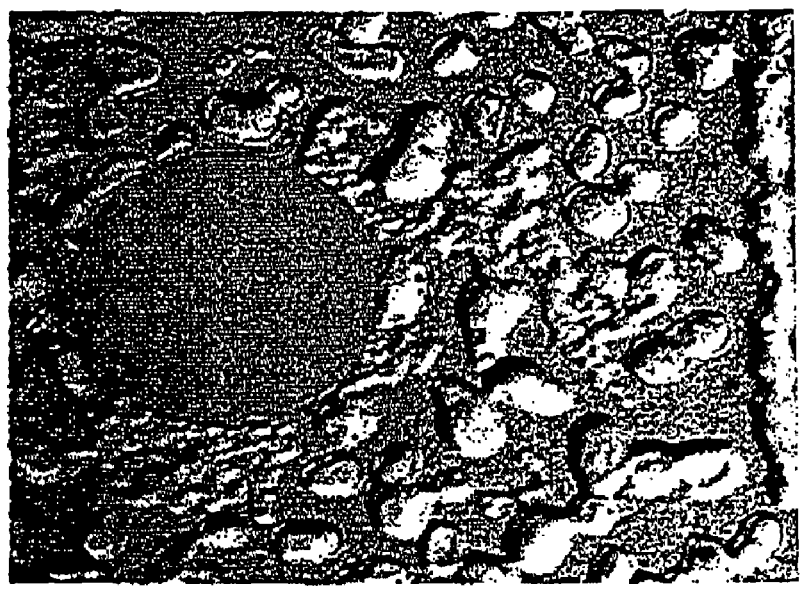
FIG. 3 shows a photomicrograph of the surface morphology of the P-type ohmic contact electrode in FIG. 2 after the annealing process is performed at 400° C. for sixty seconds (magnification ratio: 400 times).
Figure 9:
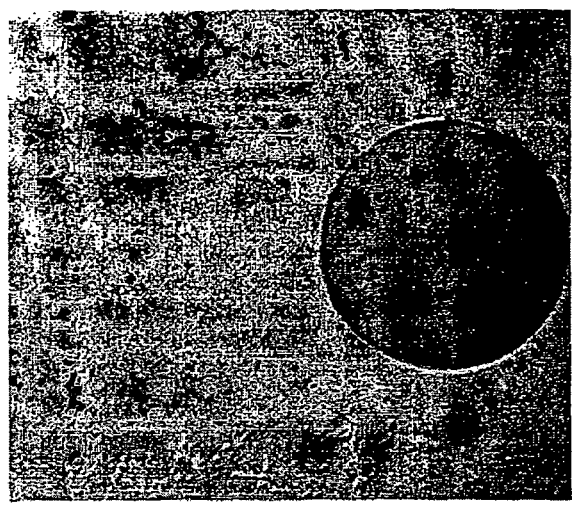
FIG. 9 shows another photomicrograph of the surface morphology of the P-type ohmic contact electrode of the light-emitting device according to the present invention.

FIG. 9 shows the surface morphology of the P-type ohmic contact electrode 80 of the light-emitting device 60 according to the present invention, which is annealed at 300° C. for 60 seconds (magnification ratio: 400 times). The circular area is the epitaxial layer that does not need to deposit the P-type ohmic contact electrode metal. The thickness of the first nickel layer 81 is 50 nm, the thickness of the first platinum layer 82 is 80 nm, and the thickness of the first gold layer is 350 nm. Compared with FIG. 3, under the same annealing condition, the surface morphology of the present P-type ohmic contact electrode 80 is very uniform, and suitable for the subsequent metal wire bonding.

Figure 1:
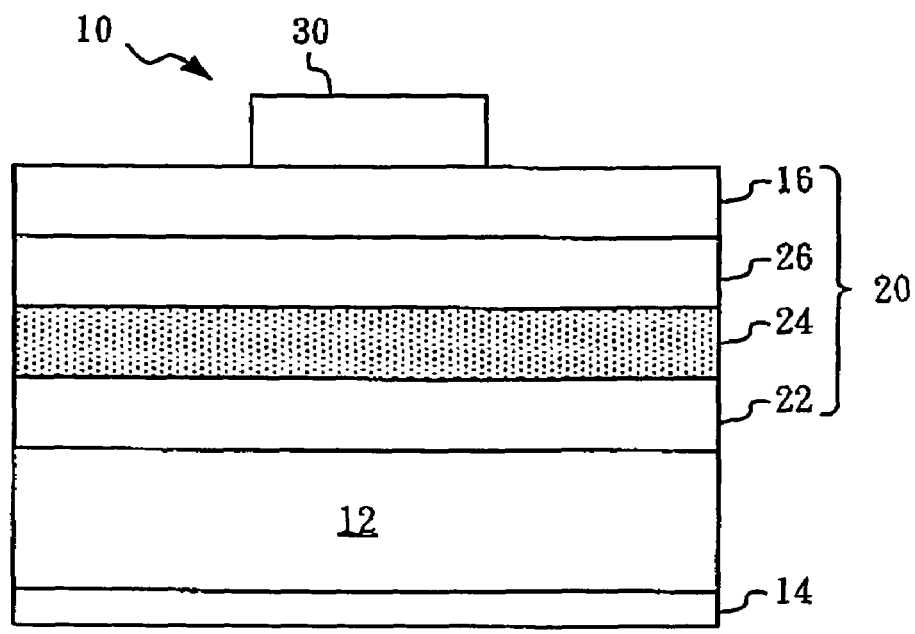
FIG. 1 is a cross-sectional view of a light-emitting device according to the prior art.
Figure 2:
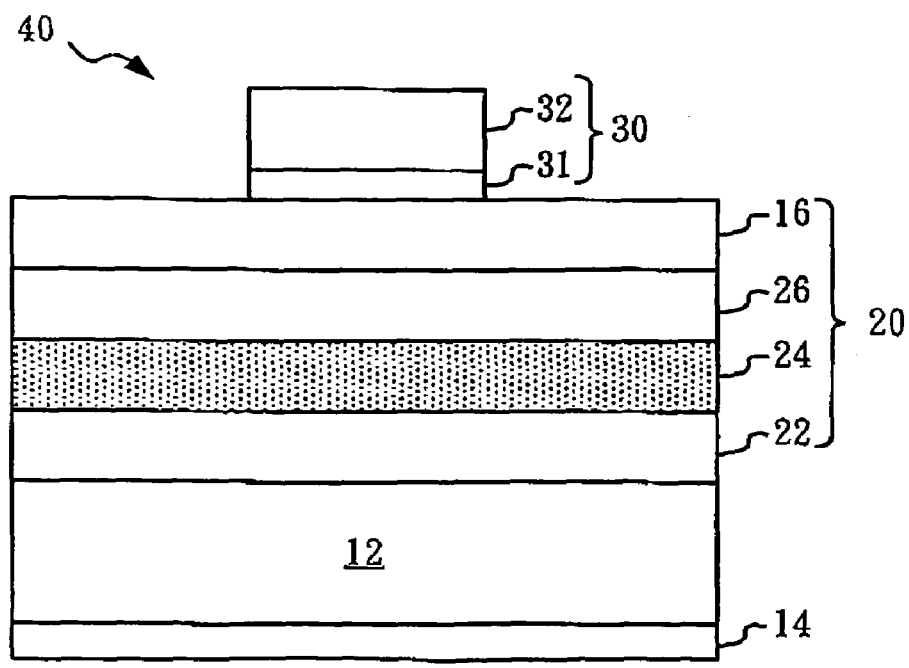
FIG. 2 is a cross-sectional view of another light-emitting device according to the prior art.
Figure 4:
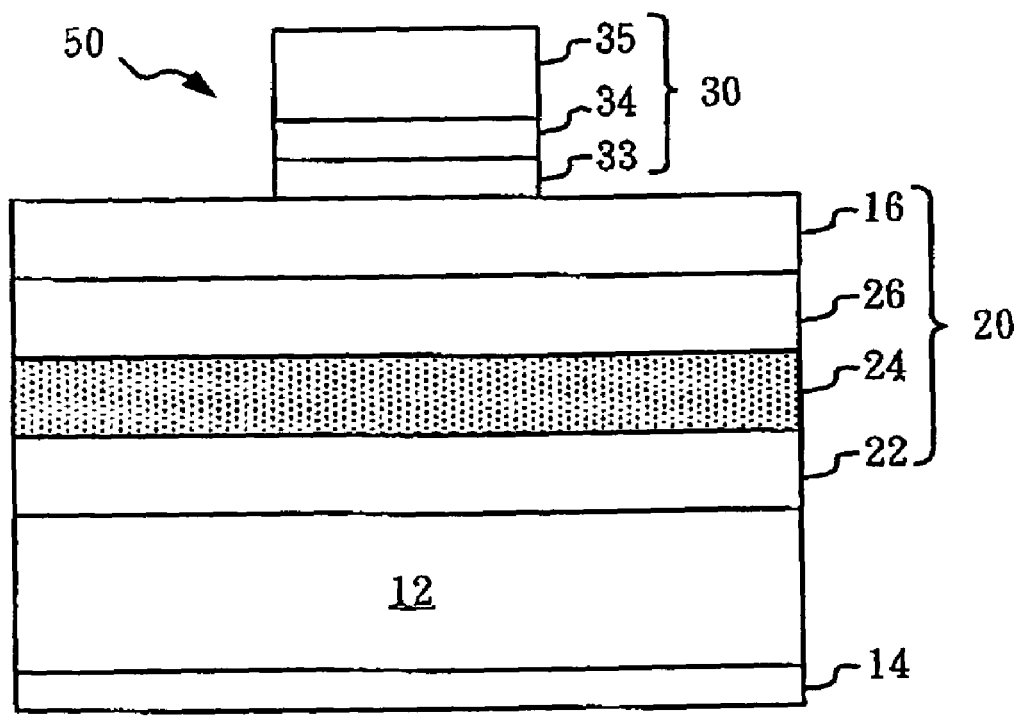
FIG. 4 is a cross-sectional view of another light-emitting device according to the prior art.
Figure 5:
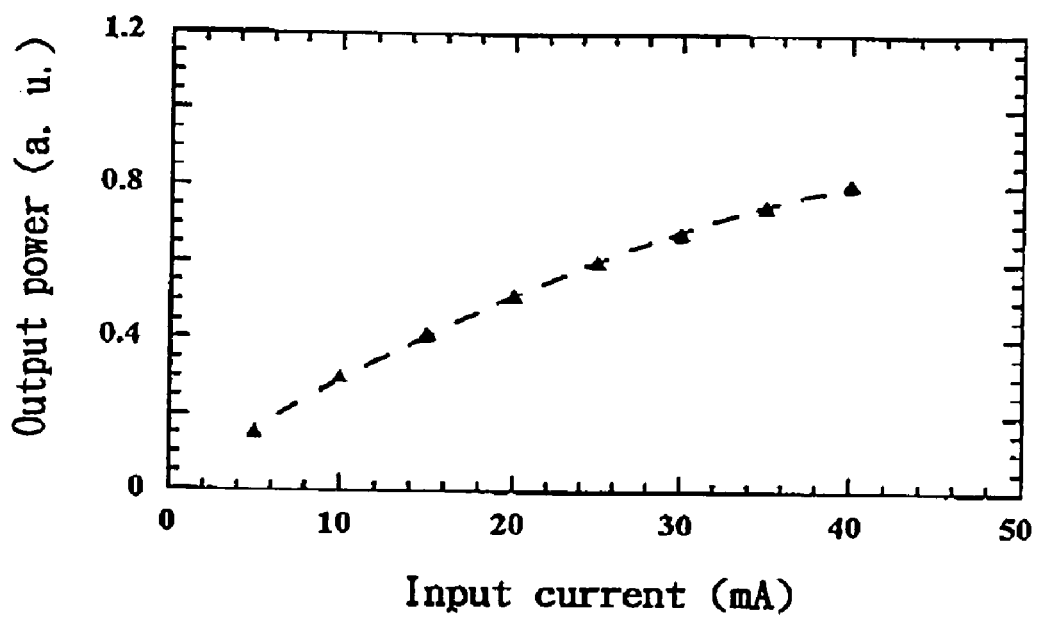
FIG. 5 shows a a graphic illustration of the input current/output power curve of light-emitting device in FIG. 4.
Figure 10:
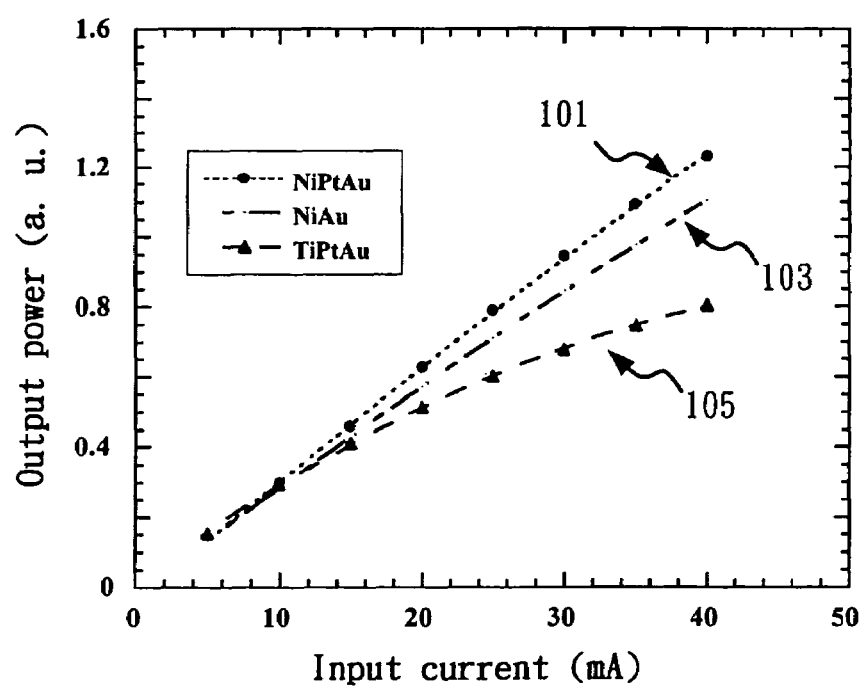
FIG. 10 shows a graphic illustration of the input current/output power curves of the present light-emitting device and the conventional light-emitting device.

FIG. 10 shows the input current/output power curves of the present light-emitting device and the conventional light-emitting device. The curve 105 denotes the input current/output power curve of the light-emitting device 50 shown in FIG. 4, the curve 103 denotes the input current/output power curve of the light-emitting device 40 shown in FIG. 2, and the curve 101 denotes the input current/output power curve of the present light-emitting device 60. As shown in FIG. 10, the curve 101 has the widest linear range, the curve 103 has a narrower linear range, while the curve 105 has the narrowest linear range. Compared with the prior art, the curve 101 of the present light-emitting device 60 has the widest linear range, which is easy to control the output power of the light-emitting device 60 by the input current. Additionally, under the same input current condition, the output power of curve 101 is the highest, i.e., the present light-emitting device 60 has higher output power at the same input current.

Figure 11:
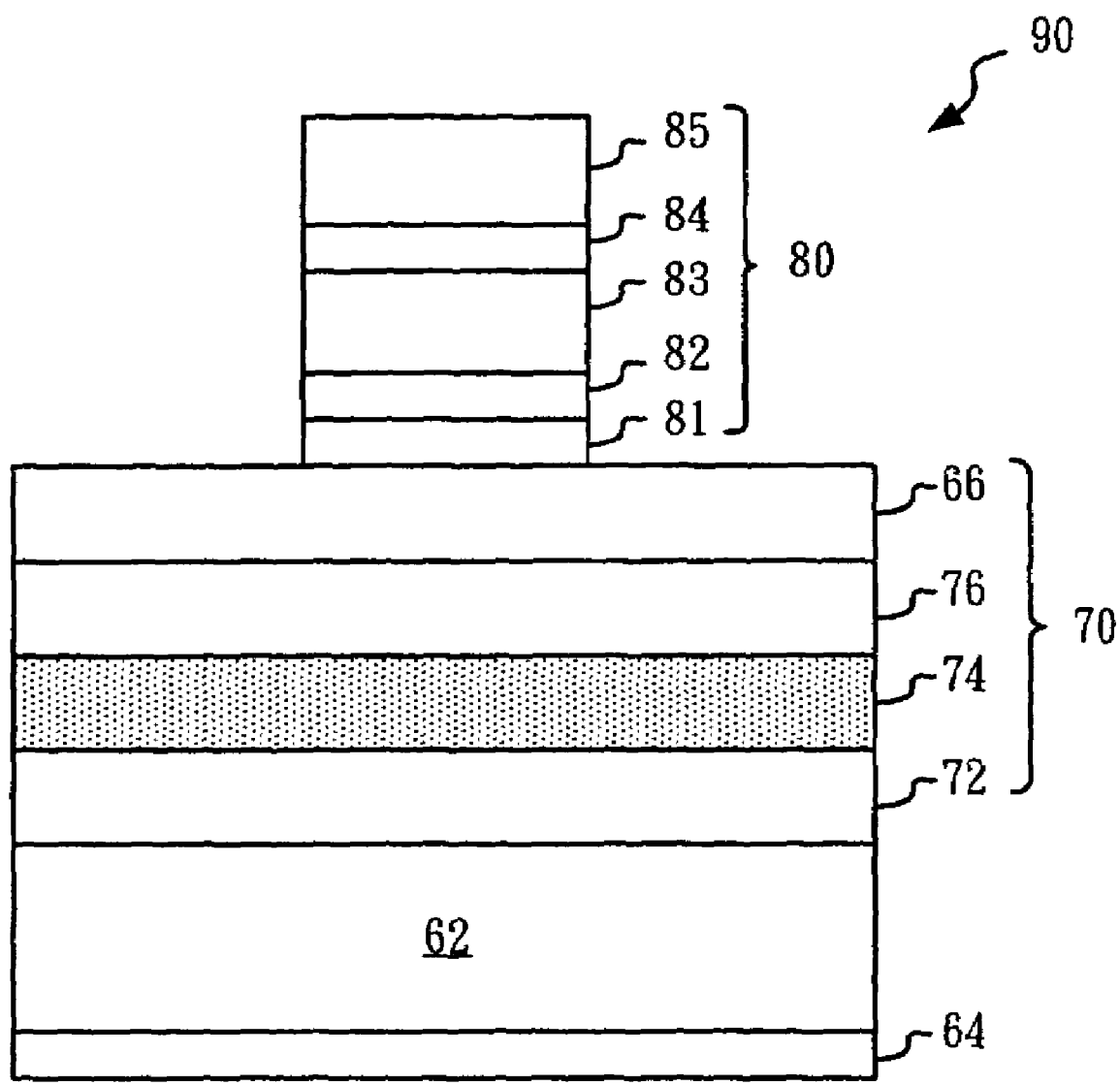
FIG. 11 is a cross-sectional view of a light-emitting device according to the second embodiment of the present invention.

FIG. 11 is a cross-sectional diagram of a light-emitting device 90 according to the second embodiment of the present invention. As shown in FIG. 11, the P-type ohmic contact electrode 80 of the light-emitting device 90 is a five-layer structure. The P-type ohmic contact electrode 80 of the light-emitting device 90 further comprises a nickel-chrome alloy layer 84 and a second gold layer 85 in addition to the first nickel layer 81, the first platinum layer 82 and the first gold layer 83. A pure nickel layer or a pure chrome layer also can replace the nickel-chrome alloy layer 84, and the metal wire is bonded on the surface of the second gold layer 85 directly.

Figure 12:
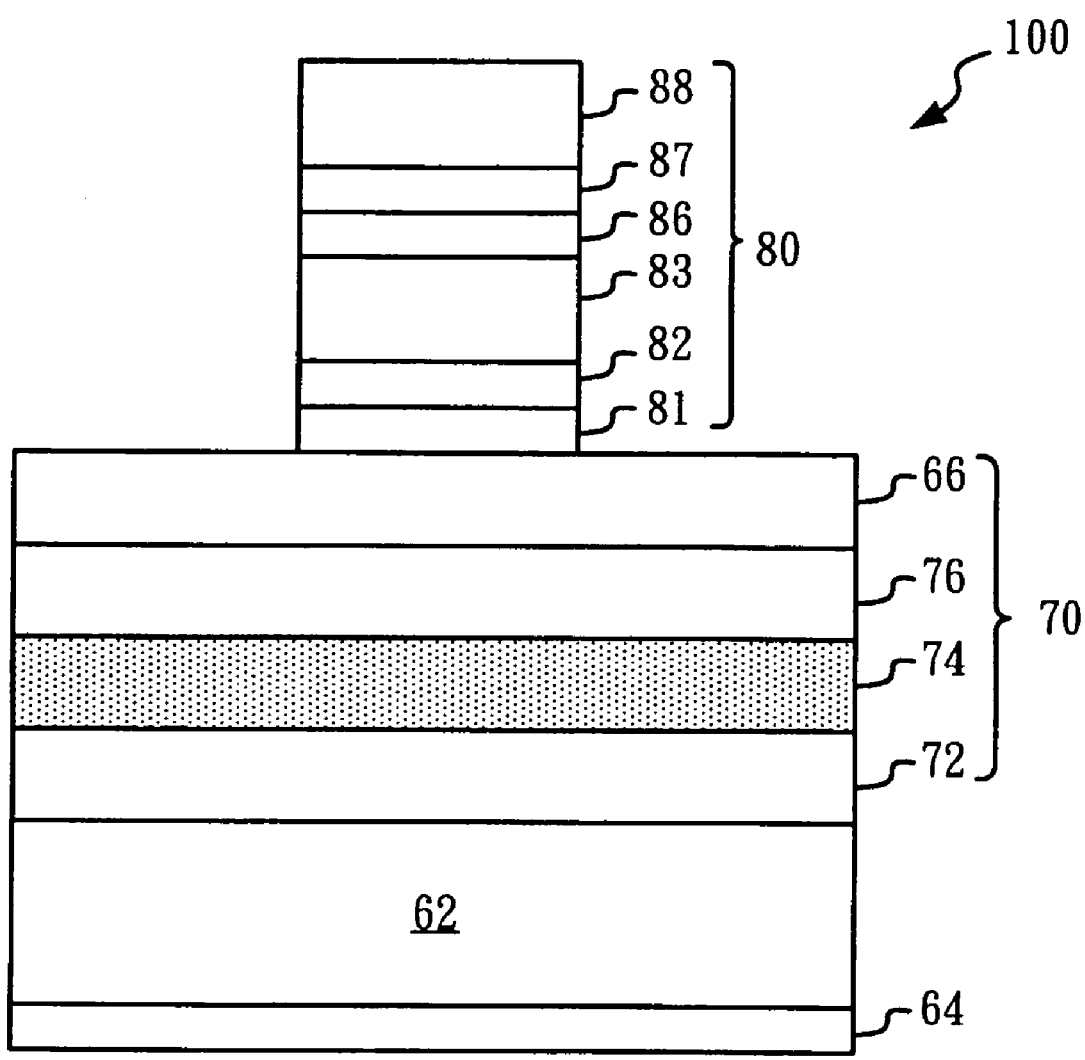
FIG. 12 is a cross-sectional view of a light-emitting device according to the third embodiment of the present invention.

FIG. 12 is a cross-sectional diagram of a light-emitting device 100 according to the third embodiment of the present invention. As shown in FIG. 12, the P-type ohmic contact electrode 80 of the light-emitting device 100 is a six-layer structure. The P-type ohmic contact electrode 80 of the light-emitting device 100 further comprises a metal layer 86, a second platinum layer 87 and a third gold layer 88 in addition to the first nickel layer 81, the first platinum layer 82 and the first gold layer 83. The metal layer 86 also can be made of nickel or titanium, and the metal wire is bonded on the surface of the third gold layer 88 directly.

Compared with the prior art, the present light-emitting de possesses the following advantages:

1. The annealing temperature for forming the P-type ohmic contact electrode and the N-type ohmic contact electrode can be reduced to a range between 220 and 330° C., which can avoid to damage the device by dramatically reducing the cross-diffusion between the layers of the epitaxial structure generated at a higher annealing temperature. Additionally, the P-type ohmic contact electrode and the P-type contact layer have better ohmic contact properties.

2. The P-type ohmic contact electrode still possesses a uniform surface morphology after the annealing process is performed, and the metal wire can be bonded on the surface of the P-type ohmic contact electrode directly. As a result, the present invention only needs one mask for defining the position and the size of the P-type ohmic contact electrode, thus the present invention can simplify the fabrication of the light-emitting device and reduce the production cost.

3. The present light-emitting device has a wider linear range in the input current/output power curve. Furthermore, under the same input current, the present light-emitting device has a higher output power.

4. The present fabricating method for the P-type ohmic contact electrode and the N-type ohmic contact electrode at a lower annealing temperature also can be applied to other semiconductor devices, such as the metal field effect transistor, the PIN diode, the photosensitive diode, the photosensitive transistor and the solar cell, etc.

The above-described embodiments of the present invention are intended to be illustrative only. Numerous alternative embodiments may be devised by those skilled in the art without departing from the scope of the following claims.

I claim:

1. A light-emitting device comprising:
    a substrate having a first surface and a second surface;
    an N-type ohmic contact electrode positioned on said first surface of said substrate;
    an epitaxial structure positioned on said second surface of said substrate, said epitaxial structure having a plurality of epitaxial layers and a P-type contact layer; and
    a P-type ohmic contact layer comprising:
        a first nickel layer positioned on said epitaxial structure;
        a first platinum layer positioned on said first nickel layer;
        a first gold layer positioned on said first platinum layer;
        a nickel-chrome layer positioned on said first gold layer; and
        a second gold layer positioned on said nickel-chrome alloy layer.

2. The device of claim 1, said first nickel layer having a thickness of between 10 and 10,000 Angstroms.

3. The device of claim 1, said first platinum layer having a thickness of between 10 and 10,000 Angstroms.

4. The device of claim 1, said first gold layer having a thickness of between 10 and 10,000 Angstroms.

* * * * *